United States Patent [19]

Thorn et al.

[11] Patent Number: 5,389,270
[45] Date of Patent: Feb. 14, 1995

[54] COMPOSITION AND PROCESS FOR PREPARING A NON-CONDUCTIVE SUBSTRATE FOR ELECTROPLATING

[75] Inventors: Charles E. Thorn, Newport, Ky.; Frank Polakovic, Ringwood, N.J.; Charles A. Mosolf, Juno Beach, Fla.

[73] Assignee: Electrochemicals, Inc., Youngstown, Ohio

[21] Appl. No.: 62,943

[22] Filed: May 17, 1993

[51] Int. Cl.$^6$ .......................... C10M 125/02
[52] U.S. Cl. ........................ 252/22; 252/29
[58] Field of Search ............ 205/118, 122, 125, 205; 252/22, 11, 29

[56] References Cited

U.S. PATENT DOCUMENTS

| | | | |
|---|---|---|---|
| 3,099,608 | 7/1963 | Radovsky et al. | 204/15 |
| 3,163,588 | 12/1964 | Shortt et al. | 204/16 |
| 3,655,530 | 4/1972 | Taylor | 204/15 |
| 3,870,987 | 3/1975 | Wiley et al. | 338/214 |
| 3,881,048 | 4/1975 | Bertrand | 428/447 |
| 3,983,042 | 9/1976 | Jain et al. | 252/18 |
| 4,104,178 | 8/1978 | Jain et al. | 252/30 |
| 4,187,334 | 2/1980 | LaBate | 427/236 |
| 4,205,974 | 6/1980 | Franz | 65/40 |
| 4,213,870 | 7/1980 | Loran | 252/11 |
| 4,239,818 | 12/1980 | LaBate | 427/236 |
| 4,254,180 | 3/1981 | Kline | 428/323 |
| 4,316,831 | 2/1982 | LaBate | 260/29.6 S |
| 4,321,295 | 3/1982 | Smith-Johannsen | 428/206 |
| 4,619,741 | 10/1986 | Minten et al. | 204/15 |
| 4,622,107 | 11/1986 | Piano | 204/15 |
| 4,622,108 | 11/1986 | Polakovic et al. | 204/15 |
| 4,631,117 | 12/1986 | Minten et al. | 204/15 |
| 4,684,560 | 8/1987 | Minten et al. | 428/131 |
| 4,718,993 | 1/1988 | Cupta et al. | 204/15 |
| 4,724,005 | 2/1988 | Minten et al. | 106/307 |
| 4,735,734 | 4/1988 | Staub et al. | 252/22 |
| 4,818,437 | 4/1989 | Wiley | 252/511 |
| 4,818,438 | 4/1989 | Wiley | 252/511 |
| 4,874,477 | 10/1989 | Pendleton | 204/15 |
| 4,889,750 | 12/1989 | Wiley | 428/34.2 |
| 4,897,164 | 1/1990 | Piano et al. | 204/15 |
| 4,911,796 | 3/1990 | Reed | 204/15 |
| 4,964,959 | 10/1990 | Nelsen et al. | 204/15 |
| 4,994,153 | 2/1991 | Piano et al. | 204/15 |
| 5,015,339 | 5/1991 | Pendleton | 204/15 |
| 5,041,242 | 8/1991 | Fowle et al. | 252/511 |
| 5,106,537 | 4/1992 | Nelsen et al. | 252/502 |
| 5,108,553 | 4/1992 | Foster et al. | 205/125 |
| 5,110,355 | 5/1992 | Pendleton | 106/1.11 |
| 5,139,642 | 8/1992 | Randolph et al. | 205/125 |

*Primary Examiner*—John Niebling
*Assistant Examiner*—Edna Wong
*Attorney, Agent, or Firm*—McAndrews, Held & Malloy, Ltd.

[57] ABSTRACT

The present invention is directed to an improved composition and process for preparing a non-conductive substrate for electroplating. The composition comprises 0.1 to 20% by weight graphite having a mean particle size within the range of 0.05 to 50 microns; 0.01 to 10% by weight of a water soluble or dispersible binding agent for binding to the graphite particles; an effective amount of an anionic dispersing agent for dispersing the bound graphite particles; a pH within the range of 4–14; and an aqueous dispersing medium. Optionally, the composition may contain an amount of a surfactant that is effective for wetting the through hole. The resulting graphite dispersion is capable of uniformly coating the through holes in either a double-sided or multi-layer circuit board prior to electroplating. Through holes that were treated with the disclosed graphite dispersion prior to electroplating were free of visible voids after electroplating.

8 Claims, No Drawings

COMPOSITION AND PROCESS FOR PREPARING A NON-CONDUCTIVE SUBSTRATE FOR ELECTROPLATING

BACKGROUND OF THE INVENTION

A. Field Of The Invention

The present invention is directed to the field of double-sided or multi-layer circuit boards. In particular, the present invention is directed to a composition and a process for preparing the non-conductive surfaces in the through holes of a multi-layer or double-sided circuit board for electroplating, wherein the electroplated through hole is of uniform diameter and substantially void free. The present invention is useful because it eliminates one of the defects commonly associated with the electroplating of through holes in a multi-layer or double-sided circuit board in both additive and semi-additive processes.

B. Background

Printed circuit boards refer to solid circuits that are formed from a conductive material that is positioned on opposite sides of an insulating material. Where the printed circuit board has two conductive surfaces positioned on opposite sides of a single insulating layer, the resulting circuit board is known as a "double sided circuit board." In order to make electrical connections between the circuits on opposite sides of the double-sided circuit board, a hole is first drilled through the double-sided circuit board i.e., through the two conducting sheets and the insulator board. These holes are known in the art as "through holes." To accommodate even more circuits on a single board, several copper layers are sandwiched between boards of insulating material to produce a multi-layer circuit board. Like the double-sided circuit boards, the multi-layer circuit boards also use "through holes" to complete circuits between the circuit patterns.

Various processes have evolved over the years for forming a conductive pathway between the various circuits, via the through hole. Initially, a number of mechanical means (e.g., rivets or eyelets) were used. However, these were labor intensive to install and proved unreliable with age.

U.S. Pat. No. 3,099,605 (Radovsky), which issued on Jul. 30, 1963, discloses an improved method for forming a conductive pathway through a through hole by first coating the through hole with colloidal palladium ($PdCl_2 + SnCl_2$) and then electroplating over the coating. Radovsky states that prior efforts, which used graphite to form a conductive base coating on the exposed areas of a through hole, suffered from many "defects." ['605 at col. 1, ln. 66]. These defects were said to include the "lack of control of the graphite application with the resultant poor deposit of the electroplated metal and non-uniform through hole diameters." ['605 at col. 1, ln. 66-70].

Radovsky also teaches the recognition in the art that the electroless plating method (i.e., chemical depositing) "has advantages over the graphite methods." [Id. at col. 2, ln. 10-12]. "[The] advantages are essentially better control over the base layer of catalyst metal deposition and a resultant improved electroplating process with more uniform hole diameters." [Id. at col. 2, ln. 12-15].

It is an object of the present invention to provide a composition that uniformly coats the non-conductive surface(s) of a through hole and that allows a uniform deposit of electroplated metal to securely form thereon.

U.S. Pat. No. 3,163,588 (Shortt), which issued on Dec. 29, 1964, briefly suggests that a through hole surface may be rendered conductive prior to electroplating by either chemical ("electroless") deposition of a metal or by applying a "paint or ink" for instance, containing a substance such as "graphite." ['588 at col. 3, ln. 57-58]. However, the above description of Radovsky, which was filed on Dec. 30. 1959, more than three years after the filing date (Feb. 14, 1955) of Shortt, describes the "defects" associated with using a paint or ink containing graphite, such as referenced in Shortt. Because of industry recognized defects, such as pointed out in Radovsky, the industry turned to electroless deposition.

U.S. Pat. No. 4,619,741 (Minten), which issued on Nov. 11, 1986, teaches that for a "quarter century" prior to its filing date, (May 5, 1986), the industry relied upon the "electroless copper deposition" to prepare the walls of a through hole for electroplating. ['741 at col. 1, ln. 25-28]. Although electroless deposition provided superior results to the prior art methods for preparing a through hole surface, electroless deposition has several commercial disadvantages. As pointed out by Minten, these disadvantages include a six step process prior to electroplating; "a reactively long process time;" "multiple treatment baths" ; a "complex chemistry which may require constant monitoring and individual ingredients which may require separate replenishment;" a "palladium/tin activator [which] also may require extensive waste treatment;" and "the multiplicity of rinse baths [which] may require large amounts of water." ['741 at col. 1, ln. 66 to col. 2, ln. 7].

To overcome the stated disadvantages associated with the electroless deposition method, the '741 patent coats the non-conductive surface(s) of a through hole wall of a printed circuit board with carbon black particles prior to electroplating. The '741 patent expressly teaches that "graphite particles" are not capable of substituting for the carbon black particles: "when graphite particles are used as a replacement for the carbon black particles of this invention, loss of adhesion of the copper to the non-conducting material after the subsequent electroplating was noted. See comparisons 1 and 2 below." ['741 at col. 7, ln. 11-16]. In comparison I of the '741 patent, through holes that were electroplated after application of the first substitute graphite formulation (2.5% by weight graphite) had only a few visible voids, "but failed the solder shock test." ['741 at col. 20. ln. 5-7]. According to the '741 patent, "[t]he plated on copper in the holes pulled away from the epoxy/glass fiber layer." [Id. at ln. 7-8]. The results were even worse with the second substitute graphite formulation (0.5% by weight graphite). After electroplating, the boards that were treated with the second substitute formulation "had no or very few unvoided holes" (i.e., they had voided holes) ['741 at col. 20, ln. 14]. According to the '741 patent, "[t]he standard shock test could not be run on boards that were prepared with this latter graphite formulation because of the lack of unvoided holes." ['741 at col. 20, ln. 14-16]. According to the '741 patent, "both graphite formulations were far inferior for electroplating preparation as compared to the above carbon black formulations." ['741 at col. 20, ln. 17-19.

Similarly, the following U.S. patents teach that graphite is not a substitute for carbon black in carbon black formulations that conductively coat through holes prior to electroplating: U.S. Pat. No. 4,622,108 (Polakovic) at col. 8, ln. 1–5; 4,631,117 (Minten) at col. 7, ln. 24–28 ("when graphite particles are used as a replacement for the carbon black particles of this invention, the undesirable plating characteristics mentioned in U.S. Pat. No. 3,099,608 would likely occur." ); 4,718,993 (Cupta) at col. 8, ln. 27–37; and 4,874,477 (Pendleton) at col. 7, ln. 60–68.

In addition, the following U.S. patents discuss relative to the prior art the deficiencies associated with using graphite as a conductive coating prior to electroplating: U.S. Pat. Nos. 4,619,741 at col. 2, ln. 16–25; 4,622,108 at col. 2, ln. 12–20; 4,622,107 at col. 1, ln. 52–60; 4,631,117 at col. 2, ln 22–30; 4,718,993 at col. 2, ln. 21–29; 4,874,477 at col. 1, ln. 54–62; 4,897,164 at col. 1, ln. 54–62; 4,964,959 at col. 1, ln. 28–36; 5,015,339 at col. 1, ln. 56–64; 5,106,537 at col. 1, ln. 34–42; and 5,110.355 at col. 1, ln. 60–68. According to these patents, the deficiencies with the graphite process included lack of control of the graphite application, poor deposit of the resultant electroplated metal, non-uniform through hole diameters, and low electrical resistance of the graphite.

It is an object of the present invention to develop a composition that is capable of depositing a controlled and a uniform coating of graphite particles on the non-conductive surfaces of a through hole. It is also an object of the present invention that the uniformly deposited graphite coating be capable of eliminating the need for electroless plating prior to electroplating. It is a further object of the present invention that a metal electroplated over the deposited graphite coating be capable of withstanding the solder shock test.

SUMMARY OF THE INVENTION

The present invention is directed to an improved composition and process for preparing the non-conductive surface of a through hole for electroplating with a metal. The improved composition of the present invention comprises 0.1 to 20% by weight graphite having a mean particle size within the range from about 0.05 to about 50 microns; 0.01 to 10% by weight of a water soluble or dispersible binding agent for binding to the graphite particles; an effective amount of an anionic dispersing agent for dispersing the bound graphite particles; a pH within the range of 4–14; optionally, an amount of a surfactant that is effective to wet the through holes; and an aqueous dispersing medium. The improved composition of the present invention is capable of depositing a uniform coating of graphite on the non-conductive surfaces of a through hole in either a double-sided or a multi-layer circuit board. Through holes that were treated with the graphite dispersion of the present invention prior to electroplating were free of visible voids and of substantially uniform diameter after electroplating. In its second aspect, the present invention is also directed to a process for electroplating a conductive metal layer, such as copper, to the surface of a non-conductive material. In particular, the process of the present invention comprises:

(a) preparing a liquid dispersion of graphite, said dispersion comprising:
  i. 0.1 to 20% by weight graphite having a mean particle size within the range from about 0.05 to 50 microns;
  ii. 0.01 to 10% by weight of a water soluble or dispersible binding agent for binding the graphite particles;
  iii. an amount of an anionic dispersing agent that is effective for dispersing the bound graphite particles;
  iv. a pH within the range of 4–14;
  v. optionally, an effective amount of a surfactant; and
  vi. an aqueous dispersing medium; said dispersion being capable of depositing a uniform coating of graphite on the non-conductive surfaces of a through hole;
(b) applying said liquid dispersion to the non-conductive surfaces of the through hole;
(c) separating substantially all of the aqueous dispersing medium from said graphite particles, whereby the graphite particles are deposited on the non-conductive surfaces of the through hole in a substantially continuous layer; and
(d) electroplating a substantially continuous metal layer over the graphite particles deposited on the non-conductive surfaces of the through hole.

DETAILED DESCRIPTION OF THE INVENTION

The present invention has multiple aspects. In its first aspect, it is directed to a composition which is capable of uniformly coating the non-conductive surfaces of a through hole, such that a metal is capable of electroplating substantially void-free thereon in both additive and semi-additive processes. The composition of the present invention comprises:

about 0.1 to about 20% by weight graphite having a mean particle size within the range from about 0.05 to about 50 microns;

about 0.01 to 10% by weight of a water soluble or dispersible binding agent for binding to the graphite particles;

an effective amount of an anionic dispersing agent for dispersing the bound graphite particles;

a pH within the range of about 4–14;

optionally, an effective amount of a surfactant for wetting a through hole; and an aqueous dispersing medium.

To facilitate the deposition of a uniform coating of graphite particles on smaller sized through holes, the composition preferably includes an effective amount of a surfactant, typically, about 0.1% to 1% by weight of a surfactant. The resulting composition is a graphite dispersion that is capable of depositing a uniform coating of graphite particles on the non-conductive surfaces of a through hole. The composition of the present invention may be used "as is," or it may be diluted up to tenfold (10:1), preferably up to fourfold (4:1), with an aqueous dispersing medium, which may include a buffer, and/or a dispersing agent, and/or a surfactant.

The first component of the composition of the present invention is graphite. The graphite particles of the present invention are to be distinguished from carbon black particles. Carbon black particles are amorphous. In contrast, graphite particles are highly crystalline. Typically, carbon black particles are impure, frequently being associated with 1–10% volatiles. See U.S. Pat. No. 4,619,741 at col. 7,ln. 5–11. In contrast, graphite is relatively pure, particularly synthetic graphite.

In the composition of the present invention, the graphite may be either synthetic or naturally occurring. However, synthetic graphite is preferred. Synthetic graphite is formed by heat treating (graphitizing) a carbon source at temperatures exceeding 2400° C. The most conductive and most preferred graphite (electronic grade) is prepared at very high graphitization temperatures (~3000 Kelvin (°K.)).

In the composition of the present invention, the conductivity of the graphite is important. When graphite is deposited on the non-conductive surface of a through hole, it is both the conductivity of the graphite particles and their uniform deposition which enables the graphite deposit, as a whole, to act as a cathode and to uniformly electroplate a conductive metal layer thereon.

The conductivity of through hole deposits of synthetic and natural graphite are compared in Example 6 of the present invention. In Example 6, two compositions, which differed from one another based upon the presence of synthetic or natural graphite, were applied to the through holes of identical circuit boards using the method of the present invention, and their conductivities were measured. The data in Example 6 demonstrates that a uniform deposit of synthetic graphite is was approximately 30–70 times more conductive than a comparable deposit of natural graphite.

A comparison between the conductivity of a graphite composition of the present invention and a carbon black composition of U.S. Pat. No. 4,619,741 (Minten et al.) is disclosed in Example 7. The carbon black technology of the '741 patent is assigned to Olin Hunt Specialty Products, and is commercially available under the trademark BLACKHOLE from MacDermid Incorporated, Waterbury, Conn. The data in Example 7 establishes that the graphite compositions of the present invention, when used in the process of the present invention, produced through hole deposits of graphite that had substantially higher conductivities (lower resistivities) than the through hole deposits of carbon black produced by the composition and methods of the '741 patent.

The graphite particles of the present invention have a mean particle size that is within the range of 0.05 to 50 microns. From the perspective of performance and ease of dispersion, graphite particles from the smaller end of the size range are preferred. However, the smaller graphite particles are more costly. Preferably, the graphite particles have a mean particle size that is within the range of about 0.3 to 1.0 microns. More preferably, the mean particle size is within the range of about 0.7 to about 1.0 microns. Graphite particles of suitable size are prepared by the wet grinding or milling of raw graphite, having a particle size greater than 50 microns, to form a slurry of smaller particles.

The second component of the composition of the present invention is 0.01 to 10% by weight of a water soluble or dispersible binding agent for binding the graphite particles. The binding agent of the present invention is preferably any natural or synthetic polymer that is capable of both adhering to the graphite particles and of receiving an anionic dispersing agent. More preferably, the binding agent is a water soluble or a water dispersible anionic polymer. The binding agent is also believed to assist the dispersed graphite particles in adhering to the surface of the non-conductive (i.e., dielectric) layer.

A preferred binding agent for use in the present invention is the water soluble anionic polymer, sodium carboxymethylcellulose ("CMC"), such as is commercially available from Aqualon Company (Hopewell, Va.) in both low and medium viscosity forms. CMC is available in a variety of molecular weight sizes. However, for purposes of this invention, a 2% solution of the CMC binding agent should have a viscosity within the range of 25–800 cp at 25° C.

The third component of the composition of the present invention is an anionic dispersing agent. The anionic dispersing agent is a substantially smaller molecule (molecular weight less than 1000 Daltons) than the binding agent. The anionic dispersing agent has a hydrophobic end and a hydrophilic (anionic) end. It functions by surrounding the bound graphite particles and causing the bound particles to disperse. It is believed that the hydrophobic end of each anionic dispersing agent is attracted to the hydrophobic regions of the binding agent, thereby causing the anionic end of the anionic dispersing agent to stick out into surrounding the aqueous dispersing medium. When each bound graphite particle also has sufficient dispersing agent bound to it, the sphere of anionic charges surrounds each particle causes the particles to repel one another, and thus, to disperse.

The amount of anionic dispersing agent that is used in the composition of the present invention must be sufficient to cause the bound graphite particles to disperse in the aqueous dispersing medium. The amount of dispersing agent that is used is dependent upon the size of the graphite particle and the amount of binding agent bound thereto. As a general rule, smaller graphite particles require lesser amounts of dispersing agent than would be required to disperse larger particles. To determine the amount of dispersing agent that is required in any particular case, one of ordinary skill in the art would begin by adding ever increasing amounts of dispersing agent to the bound graphite particles until a sufficient amount was added to cause the particles to disperse. This amount of dispersing agent is the minimum effective amount of dispersing agent. Increasing amounts of dispersing agent could be added without adversely affecting the dispersion of the graphite particles. To ensure that the particles remain dispersed, one could add a ten percent greater amount of dispersing agent than is needed. Thus, for purposes of the present invention, the amount of anionic dispersing agent that is used in the composition of the present invention must be an amount that is effective for dispersing the bound graphite particles.

Suitable anionic dispersing agents include ACRYSOL I-1955 alkali-soluble acrylic polymer resin and ACRYSOL I-545 all-acrylic aqueous vehicle both of which are commercially available from the Rohm and Haas Co., Philadelphia, Pa. The ACRYSOL dispersing agents may be used alone or together, preferably together. A preferred ratio of ACRYSOL I-1955 to ACRYSOL I-545 is 1:4.

The composition and method of the present invention is capable of being run over a wide pH range. See Example 13. A fourth component of the composition of the present invention is a pH within the range of 4 to 14. Preferably, the pH is maintained by a pH buffer. The buffer functions by precluding or minimizing changes in pH such as may occur during the course of a run as an increasing number of boards are treated with the composition of the present invention. In addition, the absorption of $CO_2$ from the atmosphere is also capable of also changing changes in the pH. The maintenance of a constant pH or near constant pH insures the reproduceability of the composition from board to board. A particularly preferred pH range is pH 9 to 11, more preferably 9.5 to 10.5. Most preferably, a pH in the preferred range is provided by a carbonate-bicarbonate buffer.

The use of other pH buffering systems, such as phosphate, acetate, borate, barbital, and the like, are well known in the art.

An optional component of the composition of the present invention is a surfactant. One function of the surfactant is to decrease the surface tension of the aqueous dispersing medium such that the aqueous dispersing medium containing the dispersed graphite particles is able to freely penetrate into the through holes of the various circuit boards of the present invention. The diameter of the through holes is typically within the range of 0.05 mm to 5 mm. With through hole sizes within the range of 4–5 mm, a surfactant is not necessary. However, with through hole sizes below about 4 mm, an increasing amount of surfactant is recommended with decreasing through hole sizes.

The circuit boards may vary in thickness from that of a double sided circuit board to a multilayer circuit board having up to twenty-four layers. Thus, when needed, the composition of the present invention should contain sufficient surfactant to allow the aqueous dispersing medium to freely carry the dispersed graphite particles through the through holes in circuit boards of various sizes.

A second function of the surfactant is to wet the surface of the polymeric and glass substrates. This facilitates the coating of these surfaces with the graphite dispersion.

Typically, the amount of surfactant that is used falls within the range of 0.1 to 1% of the weight of the composition. The amount of surfactant that is used in any particular case will vary depending upon the surfactant itself. To determine the amount of surfactant that is required in any particular case, one would begin by adding about 0.1% by weight surfactant to the composition and increasing the amount until the desired performance was achieved. Although additional amounts of surfactant could be added, they would not provide any additional benefit.

Suitable surfactants for use in the present invention include FLUORAD® FC-120 anionic fluorochemical surfactant which is commercially available from the 3M Company, Minneapolis, Minn. This surfactant even wets difficult to wet surfaces, such as teflon-polyimide.

The final component of the final composition of the present invention is an aqueous dispersing medium. By the phrase, "aqueous dispersing medium," as used herein, is meant to include any solvent that is from 80 to 100% water wherein the balance of the material is a water soluble organic composition. Typical water soluble organic compositions include the low molecular weight alcohols, such as methanol, ethanol, and isopropanol. Additional organic molecules also include solvents such as dimethylsulfoxide (DMSO), tetrahydrofuran (THF), and ethylene or propylene glycol. Preferably, the aqueous dispersing medium is 100% water.

In its second aspect, the present invention is also directed to a process for electroplating a conductive metal layer, such as copper, to the surface of a non-conductive material. In particular, the process of the present invention comprises:

(a) preparing a liquid dispersion of graphite, said dispersion comprising:
  i. 0.1 to 20% by weight graphite having a mean particle size within the range from about 0.05 to 50 microns;
  ii. 0.01 to 10% by weight of a water soluble or dispersible binding agent for binding the graphite particles;
  iii. an amount of an anionic dispersing agent that is effective for dispersing the bound graphite particles;
  iv. a pH within the range of 4–14;
  v. optionally, an effective amount of a surfactant for wetting the through holes; and
  vi. an aqueous dispersing medium; the dispersion being capable of uniformly depositing a coating of graphite on the non-conductive surfaces of a through hole;

(b) applying the liquid dispersion to the non-conductive surfaces of a through hole to form a dispersion coating thereon;

(c) separating substantially all of the aqueous dispersing medium from the graphite particles, whereby the graphite particles are deposited on the non-conductive surface in a substantially continuous layer; and (d) electroplating a substantially continuous metal layer over the graphite particles deposited on said non-conductive surface.

Although rinse and drying steps are not included above, it is within the scope of the present invention to include rinsing steps between various reagent baths to prolong the life of the subsequent reagent baths. It is also within the scope of the present invention to include one or more drying steps, such as before an optional etching step as described in Example 13.

Preferably, between Steps (c) and (d) of the above process, one may employ a fixing step. The fixing step is important in the automated (vertical) treatment of circuit boards, since it makes the graphite dispersion more workable. The fixing step comprises applying a fixing solution to the dispersion coated surfaces of Step (b). The fixing solution smooths the graphite coating on the through hole surfaces by eliminating lumps and by making the coating more uniform. When the fixing step is utilized, the composition of the present invention is preferably run at a fourfold dilution.

In the fixing step, the fixing solution may either be water or a dilute acid. If water is used, the water must be warm (120°–140° F.) to effect fixing, whereas the dilute acid solution is capable of fixing the bound graphite at room temperature. Fixing is typically accomplished by a 30–60 second exposure of the graphite coating to the fixing solution. While not wishing to be bound by any theory, it is believed that the dilute acid fixer works faster, particularly when sodium carboxymethylcellulose is the binder, by neutralizing the carboxyl groups, thereby causing the dispersed and bound graphite particles to precipitate (i.e., to flocculate).

Typical acid fixing solutions include dilute aqueous solutions containing from 0.1–5% by volume of a mineral acid, such as hydrochloric, phosphoric, nitric, or sulfuric acid. A preferred fixing solution is a dilute aqueous solution of sulfuric acid, preferably an aqueous solution containing 0.1–2% sulfuric acid by volume. Acidic fixing solutions that contain less than 0.1% acid may require some heat to effect fixing within the typical 30–60 second exposure.

EXAMPLE 1

Preparation of Cleaner/Conditioner Concentrate

1. To a mixing tank capable of containing a 1 liter volume, was added approximately 400 g of distilled or deionized water (hereinafter collectively "DI water") and 60 g of the surfactant TERGITOL 15-S-9 (Union Carbide Corp., New York, N.Y.) secondary alcohol polyethylene glycol ether and the mixture was stirred for about ten minutes. Thereafter, 100 g of monoethanol amine (Union Carbide) was added and the mixture was again stirred for about ten minutes. To the mixture was then added 300 g of the cationic water soluble polymer CALLAWAY 6818 (Exxon Chemical Company, Columbus, Ga.) and the mixture again was allowed to stir for approximately ten minutes. Thereafter, to the mixture was added 50 g of the cationic polyamido-amine SANDOLEC ® CF (Sandoz Chemicals) and the mixture was allowed to stir for approximately ten minutes. To the mixture was then added 7 g of ethylene glycol and the mixture was allowed to stir for approximately ten minutes. Thereafter, 10 g of tetrasodiumethylenediaminetctraacetic acid (VERSENE 100. The Dow Chemical Company, Midland, Mich.), was added to the mixture and the mixture was allowed to stir for approximately ten minutes. Sufficient DI water was then added to bring the volume to 1 liter and the mixture was stirred for about 40 minutes. The resulting cleaner/conditioner concentrate was considered acceptable if it exhibited a pH 12±0.4 and the specific gravity at 20/4° C. of 1.034±0.007. Acceptable concentrate solutions were then filtered through a 10 micron polypropylene filter chamber before being packaged.

In preparing the above concentrate, a plastic or stainless steel mixing tank should be used. All equipment including the tank, pumps, heater coils, and filling lines must be properly leached before use.

EXAMPLE 2

Preparation of the Working Cleaner/Conditioner

The working cleaner/conditioner was prepared by combining one volume of the cleaner/conditioner concentrate from Example 1 with 9 volumes of DI water.

EXAMPLE 3

Cleaning and Conditioning Circuit Boards

Circuit boards, having through holes, were immersed for 4 to 6 minutes in a bath containing the working cleaner/conditioner solution at a temperature within the range of 140°–160° F., a normality of 0.15 to 0.20, and a pH within the range of 9.5 to 11.8. The tank for the cleaner/conditioner solution was stainless steel, and it had a stainless steel heater element. Alternatively, a polypropylene tank could also be used.

EXAMPLE 4

Preparation of a Working Solution of the Graphite Dispersion

To a stainless steel tank that was leached before use was added 200 g of the colloidal graphite dispersion GRAFO 1204B (Metal Lubricants Company, Harvey, Ill.) and 790 g of DI water and the mixture was stirred for approximately 20 minutes. To the mixture was then added 6 g of potassium carbonate (powder) and the mixture was stirred for approximately 15 minutes. Thereafter, 1 g of potassium bicarbonate crystals were added to the reaction mixture and it was allowed to mix for about 15 minutes. The pH of the mixture was then measured to determine if it fell within the range of 10.7 to 11.0. For solutions having a pH above 11.0. , additional potassium bicarbonate was added. For solutions having a pH below 10.7, additional potassium carbonate was added to bring it within the desired pH range of 10.7–11.0. When the solution was in the desired pH range, to it was added 0.2 grams of the acrylic emulsion polymer ACRYSOL ® I-1955 (Rohm and Haas Co., Philadelphia, Pa.) and 0.8 g of the emulsion polymer ACRYSOL ® I-545 (Rohm and Haas) and the mixture was allowed to stir for approximately 10 minutes. Thereafter, 1.2 g of the anionic fluorochemical surfactant FLUORAD ® FC-120 (3M Company, St. Paul, Minn.) was added to the mixture and the mixture allowed to stir for approximately 40 minutes.

The resulting solution was considered acceptable for use if the following criteria were met: percent solids falls within the range of 4.4 to 4.8%; the normality falls within the range of 0.11 to 0.17; and the pH falls within the range of 10.7 to 11.0.

EXAMPLE 5

Coating the Through Holes of A Circuit Board with Graphite Dispersion

The preferred equipment for the working dispersion bath comprises a polyethylene, polypropylene, or a stainless steel 316 tank. The tank is outfitted with a circulating centrifugal pump that is capable of turning over the tank volume three to six times per hour.

A circuit board having through holes was cleaned and conditioned by immersion for about 4–6 minutes in a bath at 130° F.–140° F. containing the working cleaner/conditioner solution of Example 3. Thereafter, the board was rinsed for about one minute in deionized water, at ambient room temperature (65° F.–95° F). The rinsed board was immersed from four to six minutes in a bath containing the working graphite dispersion of Example 4 at ambient room temperature.

Under working conditions, the pH of the working dispersion bath gradually decreased with time due to the absorption of $CO_2$ from the atmosphere. Normally, the pH was maintained by the replenishment of the bath with fresh working dispersion. However, if the pH goes below 9.5, a hydroxide, such as potassium hydroxide, may also be added to the working dispersion to adjust the pH to about 10.5.

EXAMPLE 6

Comparison of the Resistance of Identical Panels having Synthetic or Natural Graphite Uniformly Deposited thereon 1. The Circuit Board Panels Fourteen identical circuit board panels ("panels") were used in this comparison. Each panel was 3 inches by 3 inches and each had the same number and pattern of through holes.

2. The Graphite Dispersions

| Natural | Synthetic |
|---|---|
| 11 g Graphite 850 (Asbury Graphite Mills Inc. Asbury, N.J.); Size: 3.74 microns (mean); 2–5 micron (range) | 11 g Graphite (Micro 440) (Asbury, Asbury, New Jersey); Size: 0.44–0.55 microns |
| .55 g CMC 7M | .44 g CMC |
| .1 g TAMOL 819 | .6 g TAMOL 819 |
| 1 g Sodium Carbonate | 1 g Sodium Carbonate |

-continued

| Natural | Synthetic |
|---|---|
| 2 g K$_2$CO$_3$ | 2 g K$_2$CO$_3$ |
| 1 g KHCO$_3$ | 1 g KHCO$_3$ |
| 1 g ACRYSOL I-1955 | 1 g ACRYSOL I-1955 |
| pH 10.5 | pH 10.6 |

3. The Process

Both sample panels were run through the following steps:

| | | | |
|---|---|---|---|
| I. | Cleaner | 5 min. | 140° F. |
| II. | Rinse | 1 min. | Room Temperature |
| III. | Conditioner | 5 min. | Room Temperature |
| IV. | Rinse | 1 min. | Room Temperature |
| V. | Graphite Colloid | 5 min. | Room Temperature |
| VI. | Dry | 20 min. | 190° F. |
| VII. | Micro Etch | 50 micro inches removed | |
| VIII. | Rinse | 1 min. | Room Tempeature |
| IX. | Dry | | |

4. Resistance Measurements

The resistance of the dried panels were measured at comparable points designated (A) through (N) after drying. Both panels were 3"×3"" with the exact number and pattern of through holes.

| Synthetic Graphite | Natural Graphite |
|---|---|
| Micro 440 (Asbury) | Graphite 850 (Asbury) |
| (A) 109 ohms | 3 kilo ohms |
| (B) 85 ohms | 1.0 kilo ohms |
| (C) 180 ohms | 1.1 kilo ohms |
| (D) 210 ohms | 1.5 kilo ohms |
| Graphite 450 (Asbury) Size: (3.5–5.5 microns) | # GraphoKote 90 (Dixon Products, Lakehurst, N.J.) Size: 80% >1 micron |
| (E) 3.7 kilo ohms | 20 kilo ohms |
| (F) 800 ohms | 19 kilo ohms |
| (G) 4.3 kilo ohms | 59 kilo ohms |
| (H) 3.9 kilo ohms | 26 kilo ohms |
| (I) 250 ohms | |
| (J) 216 ohms | |
| (K) 400 ohms | |
| (L) 600 ohms | |
| (M) 195 ohms | |
| (N) 214 ohms | |

EXAMPLE 7

Comparison of the Circuit Board Resistivity after Treatment by the Graphite Composition and Method of the Present Invention, and after Treatment by the Carbon Black Composition and Method of the '741 Patent 1. The Circuit Board Panels In Example 7, identical circuit board panels ("panels") were compared. The compared panels were of the multilayer type and of the double-sided type. Each panel type measured 3 inches by 3 inches. Each type of panel had the same number and pattern of through holes. The through hole diameters of each type of panel were 0.15–1.0 mm. Each multilayer panel had four layers of copper film.

2. The Carbon Black Process

The "carbon black" composition and process that was used in this comparison was commercially available under the tradename BLACKHOLE from Olin Hunt Specialty Products Inc., now assigned to MacDermid Incorporated. According to the manufacturer, the BLACKHOLE carbon black process requires a double pass through the process to obtain good results. The cleaners and conditions that were used in the carbon black process were those recommended by the manufacturer, i.e., BLACK HOLE CLEANER II, a formulation containing monoethanolamine, SANDOLEC CF cationic polyelectrolyte, and ethylene glycol in water, and BLACK HOLE CONDITIONER, a formulation containing monoethanolamine and SANDOLEC CF polyelectrolyte in water.

Three variations of the carbon black technology are presented as Runs 1,2, and 3 below. In the process of Run 1, duplicate multilayer and double sided panels were subjected to the following sequence of steps:

| a) | Cleaner/Conditioner (25%) | 5 minutes | 135° F. |
|---|---|---|---|
| b) | Rinse | 1 minute | Room Temperature |
| c) | Conditoner (2.5%) | 5 minutes | Room Temperature |
| d) | Rinse | 1 minute | Room Temperature |
| e) | Carbon Black Dispersion (BLACKHOLE) | 5 minutes | Room Temperature |
| f) | Oven Dry | 20 minutes | 190° F. |
| g) | Carbon Black Dispersion (BLACKHOLE) | 5 minutes | Room Temperature |
| h) | Oven Dry | 5 minutes | 190° F. |

The resistances of the first set of panels were measured between comparable points after Step (f) of the process of Run 1.

| Resistance (Run 1) After Step (f) of Run 1 | |
|---|---|
| Panel | Resistance |
| (A) Multilayer | 3.6 kilo ohms |
| (B) Multilayer | 3.7 kilo ohms |
| (C) Multilayer | 1.2 kilo ohms |
| (D) Multilayer | 1.3 kilo ohms |
| (E) Double Sided | 1.9 kilo ohms |
| (F) Double Sided | 2.1 kilo ohms |
| (G) Double Sided | 1.2 kilo ohms |
| (H) Double Sided | 1.4 kilo ohms |

The resistances of a second set of panels were measured after Steps (f) and (h) of Run 1. These resistances after Steps (f) and (h) of Run 1 are compared below.

| Comparative Resistance After Steps (f) and (h) Of Run 1 | | |
|---|---|---|
| | Resistance | |
| Panel | After Step (f) | After Step (h) |
| Multilayer | 5 kilo ohms | 2.4 kilo ohms |
| Multilayer | 6 kilo ohms | 2.2 kilo ohms |
| Double Sided | 7 kilo ohms | 2.0 kilo ohms |
| Double Sided | 6 kilo ohms | 1.9 kilo ohms |

Run 2 is identical to Run 1 except that a conditioning step (Step (g)) and a rinse step (Step (h)) were added below before the second application of the carbon black dispersion. The process of Run 2 was as follows:

| a) | Cleaner/Conditioner (2.5%) | 5 minutes | 135° F. |
|---|---|---|---|
| b) | Rinse | 1 minute | Room Temperature |
| c) | Conditioner (2.5%) | 5 minutes | Room Temperature |
| d) | Rinse | 1 minute | Room Temperature |
| e) | Carbon Black Dispersion (BLACKHOLE) | 5 minutes | Room Temperature |
| f) | Oven | 20 minutes | 190° F. |
| g) | Conditioner (2.5%) | 5 minutes | Room Temperature |
| h) | Rinse | 1 minute | Room Temperature |

-continued

| | | |
|---|---|---|
| i) Carbon Black Dispersion (BLACKHOLE) | 5 minutes | Room Temperature |
| j) Oven | 20 minutes | 190° F. |

Comparative Resistance After Steps (f) and (j) Of Run 1

| | Resistance | |
|---|---|---|
| Panel | After Step (f) | After Step (j) |
| Multilayer | 5.5 kilo ohms | 3.3 kilo ohms |
| Multilayer | 6.4 kilo ohms | 3.9 kilo ohms |
| Double Sided | 6.9 kilo ohms | 1.5 kilo ohms |
| Double Sided | 4.5 kilo ohms | 1.8 kilo ohms |

Run 3 employed Steps (a) through (f) of Run 1 and added a micro etching step (Step (g)) with sodium persulfate. The micro-etching step removed 50 micro inches of copper. Thereafter, Steps (a) through (h) of Run 1 were repeated as Steps (h) through (m) of Run 3. The process of Run 3 was as follows:

| | | | |
|---|---|---|---|
| a) | Cleaner/Conditioner (2.5%) | 5 minutes | 135° F. |
| b) | Rinse | 1 minute | Room Temperature |
| c) | Conditioner (2.5%) | 5 minutes | Room Temperature |
| d) | Rinse | 1 minute | Room Temperature |
| e) | carbon black dispersion (BLACKHOLE) | 5 minutes | Room Temperature |
| f) | Oven | 20 minutes | 190° F. |
| g) | Micro Etch (Sodium Persulfate) | | |

After Micro Etch, the boards were processed through the same line again:

| | | | |
|---|---|---|---|
| h) | Cleaner/Conditioner (2.5%) | 5 minutes | 135° F. |
| i) | Rinse | 1 minute | Room Temperature |
| j) | Conditioner (2.5%) | 5 minutes | Room Temperature |
| k) | Rinse | 1 minute | Room Temperature |
| l) | carbon black dispersion (BLACKHOLE) | 5 minutes | Room Temperature |
| m) | Oven | 20 minutes | 190° F. |

Comparative Resistance After Steps (f), (g), and (m) of Run 3

| | Resistance | | |
|---|---|---|---|
| Panel | After Step (f) | After Step (g) | After Step (m) |
| Multilayer | 5.5 kilo ohms | 280 kilo ohms | 3.2 kilo ohms |
| Multilayer | 6.4 kilo ohms | 300 kilo ohms | 3.9 kilo ohms |
| Double Sided | 6.9 kilo ohms | 105 kilo ohms | 1.1 kilo ohms |
| Double Sided | 4.5 kilo ohms | 150 kilo ohms | 1.7 kilo ohms |

3. The Graphite Dispersion of the Present Invention

In each of Rinse 4–7, panels of identical size, and configuration, as used above, were subject to the same preparative steps (Steps (a)–(d)) described above. However, instead of them being immersed in a carbon black dispersion, the four panels of each of Runs 4–7 were immersed in the graphite dispersion of Example 8.

The process of Runs 4–7 comprised the following steps:

| | | | |
|---|---|---|---|
| a) | Cleaner/Conditoner (2.5%) | 5 minutes | 140° F. |
| b) | Rinse | 1 minute | Room Temperature |
| c) | Conditioner (2.5%) | 5 minutes | Room Temperature |
| d) | Rinse | 1 minute | Room Temperature |
| e) | Graphite Dispersion | 5 minutes | Room Temperature |
| f) | Oven Dry | 20 minutes | 190° F. |

Resistance Measured After Step (f)

| | Panel | Resistance |
|---|---|---|
| RUN 4 | Multilayer | 60 ohms |
| | Multilayer | 80 ohms |
| | Double Sided | 27 ohms |
| | Double Sided | 42 ohms |
| RUN 5 | Multilayer | 52 ohms |
| | Multilayer | 73 ohms |
| | Double Sided | 53 ohms |
| | Double Sided | 93 ohms |
| RUN 6 | Double Sided | 60 ohms |
| | Double Sided | 172 ohms |
| | Double Sided | 71 ohms |
| | Double Sided | 126 ohms |
| RUN 7 | Multilayer | 89 ohms |
| | Double Sided | 95 ohms |
| | Multilayer | 89 ohms |
| | Double Sided | 23 ohms |

Double Pass (Graphite)

To test the effect of a double pass through the graphite dispersion, a pair of multilayer panels (Multilayer #1 and #2) were subjected to the process of Steps (a) through (f) and their respective resistances measured:

| Resistance After The First Pass | |
|---|---|
| Multilayer #1 | 24 ohms |
| Multilayer #2 | 30 ohms |

Thereafter, multilayer Panels #1 and #2 were subjected to a second immersion again immersed in the graphite dispersion (Step (e)) and then dried (Step (f)) and their respective resistances were again measured:

| Resistance After the Second Pass | |
|---|---|
| Multilayer #1 | 8 ohms |
| Multilayer #2 | 8 ohms |

In another series of runs, a second pair of multilayer panels (multilayer #3 and #4) were subjected to two passes through the process of Steps (a) through (f) and their resistance were measured after Step (f) of each pass:

| Resistance After First Pass | |
|---|---|
| Multilayer #3 | 32 ohms |
| Multilayer #4 | 34 ohms |
| Resistance After Second Pass | |
| Multilayer #3 | 13 ohms |
| Multilayer #4 | 11 ohms |

EXAMPLE 8

For use in Examples 9–11 herein, the following cleaner/conditioner, graphite composition, and fixer solutions were prepared.

Working Cleaner/Conditioner

A working cleaner/conditioner solution was prepared by diluting one volume of the cleaner/conditioner concentrate with nine volumes of DI water. In practice, the working cleaner/conditioner was maintained within the range of 140°–160° F.

Graphite Composition:

Using the method of Example 4, the following components were mixed together and the pH adjusted to 10.5:

| | |
|---|---|
| 1200 ml | Grapho 1204B (Metal Lubricants) |
| 4800 ml | DI water |
| 36 g | potassium carbonate |
| 6 g | potassium bicarbonate |
| 1.2 g | ACRYSOL I-1955 |
| 4.8 g | ACRYSOL I-545 |

-continued

| | |
|---|---|
| 7.4 g | FLUORAD FC-120 |

Fixer Bath:

Sixteen mls of concentrated sulfuric acid was added to a sufficient volume of DI water to avoid splattering and then diluted to 4 liters. In practice, the diluted sulfuric acid solution is placed in a fixer bath and heated between 120° F.–140° F. The graphite composition of the present invention is fixed by immersing the graphite coated circuit board or dielectric in the bath for a time between thirty seconds and one minute.

EXAMPLE 9

A desmeared 3 ″″×3″ ″ four layer circuit board (Sample 1) and a 2″37 ×2″″ four layer circuit board (Sample 2) were treated with the working cleaner and conditioner of Example 8, rinsed with DI water for about 15–20 seconds, and then treated with the graphite composition of Example 8. The resistivity of the dried boards was as follows:

| | |
|---|---|
| Sample 1: | 10 ohms |
| Sample 1 (after etching) | 38.1 ohms |
| Sample 2 | 19 ohms |

EXAMPLE 10

Effect of Dilution On the Composition and Method of the Present Invention

In this Example, three concentrations of the graphite composition of Example 8 were tested on both 2″″×2″″ double sided ("DS") and multi-layer ("ML") coupons. The concentrations tested were "as is, " at a two-to-one (2:1) dilution and at an eight-to-one (8:1) dilution.

LINE MAKEUP for GRAPHITE PROCESS

1) Working Cleaner/Conditioner from Example 8, 5 minutes, at 149° F.
2) Rinse—DI water, 15–20 seconds.
3) Graphite composition ("as is," 2:1, or 8:1), 5 minutes, at room temperature, i.e., 75° F.

The three graphite compositions contained the following:

1) the graphite composition of composition of Example 8. In addition, the diluted graphite compositions (i.e., 2:1 and 8:1) also contained the following:
2) sufficient DI water for the 2:1 and 8:1 dilutions of the composition of Example 8;
3) potassium carbonate, 3 g;
4) potassium bicarbonate, 0.5 g;
5) ACRYSOL I-1955, 0.1 g;
6) ACRYSOL I-545, 0.4 g; and
7) FLUORAD FL-120. 0.6 g.
4) Fixer as per Example 8, when used below.
5) Dry a) blow dry 1–2 minutes.
 b) oven dry 15 minutes, at 180° F.

| RESULTS | | |
|---|---|---|
| Coupon | Resistivity (ohms) | Comments |
| "As is" ML, with fixer | 1.1 | Small holes clogged, surface lumps |
| "As is" DS, with fixer | 1.2 | Small holes clogged, surface lumps |
| 2:1 ML, with fixer | 6.5 | 100% surface coverage |
| 8:1 ML, with fixer | 336 | 90% surface coverage |
| 8:1 DS, with fixer | 49 | 90% surface coverage |
| "As is" ML, no fixer | 1.1 | Small and large holes clogged, no surface lumps |
| "As is" DS, no fixer | 0.8 | Small and large holes clogged, no surface lumps |
| 8.1 ML, no fixer | 7.1 | 100% surface coverage |
| 8.1 DS, no fixer | 7.5 | 100% surface coverage |

| Coupon | Pre Etch Resistivity (From Example 10) | Post Etch Resistivity |
|---|---|---|
| "As is" ML, fixer | 1.1 ohms | 508 ohms |
| "As is" ML, no fixer | 1.1 ohms | 223 ohms |
| 2:1 ML, fixer | 6.5 ohms | 156 ohms |
| 8:1 ML, fixer | 336 ohms | >4,600 ohms |
| 8:1 ML, no fixer | 7.1 ohms | 417 ohms |

| Coupon | % Coverage | Comments |
|---|---|---|
| "As is" Ml, fixer | 50–90% | Approximately 100% glass voided |
| "As is" ML, no fixer | 60–90% | Glass voids, lat. glass voids, void cracks |
| 2:1 ML, fixer | 95% | Glass voids, void cracks |
| 8:1 ML, fixer | 10–20% | Glass voids, void cracks, epoxy voids |
| 8:1 ML, no fixer | 90–95% | Glass voids, lat. glass voids, void cracks |
| 14:1 ML, no fixer | 60–70% | Epoxy, glass and lat. glass voids, void cracks |
| 30:1 ML, no fixer | 40–60% | Epoxy, glass and lat. glass voids, void cracks |
| 70:1 ML, no fixer | 0–20% | Epoxy, glass and lat. glass voids, void cracks |
| 150:1 ML, no fixer | 0.5% | Epoxy, glass and lat. glass voids, void cracks |

EXAMPLE 13

Effect of pH of the Graphite Dispersion's Ability to Act as a Conductive Surface for Electroplating A stock bath of the graphite dispersion of the present invention was prepared as described herein and its pH was found to be 10.47. This sample was run as the control. Two aliquots of the dispersion had their pHs adjusted to 5.18 and 13.3 respectively. Three identical panels, namely panel #1 (pH 10.47), panel #2 (pH 5.18), and panel #3 (pH 13.3), were subjected to the following process which differed for each panel only in the indicated pH of the dispersion.

| | |
|---|---|
| 1) Cleaner/Conditioner | 162° F., 5 minutes |
| 2) Water rinse | Room Temperature (RT), 2 minutes |
| 3) Graphite Dispersion Bath | RT, 5 minutes |
| 4) Fixer | 120° F., 45 seconds |
| 5) Dry | Blow Dry |
| 6) Etch | 30 micro inches of copper removed |
| 7) Preplate | Clean Circlean S, 120° F., 30 seconds |
| 8) Rinse | 30 seconds |
| 9) Etch sodium persulfate | 1 min. 15–20 micro inches removed |
| 10) Rinse | 1 minute |

| -continued | |
|---|---|
| 11) Electroplate | 5 minutes, 15 amp/3 panels |

Results:

All three panels initiated at an equal time (1 minute). After five minutes, the coverage was the same on all panels and no voids, blisters or lumps were observed under an 8× eye loupe.

EXAMPLE 14

Effect of pH on Resistivities

The resistivities of the three panels were measured at various points during the process of Example 13. The three panels based upon the pH of the graphite dispersion, are identified as #1 (control pH 10.47), panel #2 (pH 5.18), and panel #3 (pH 13.3):

| Resistivity Before Etch (Step 6) |
|---|
| 1. —, 21 ohms |
| 2. 36 ohms |
| 3. 35.6 ohms |
| Resistivity After Etch (Step 6) |
| 1. 76 ohms |
| 2. 66 ohms |
| 3. 110 ohms |
| Resistivity After Chem Clean (Step 7) |
| 1. 218 ohms |
| 2. 113 ohms |
| 3. 182 ohms |

What is claimed is:

1. A composition consisting essentially of:

about 0.1 to about 20% by weight graphite having a mean particle size within the range from about 0.05 to about 50 microns;

about 0.01 to 10% by weight of a water soluble or dispersible binding agent for binding to the graphite particles;

an amount of an anionic dispersing agent for effective for dispersing the bound graphite particles;

a pH within the range of about 9-11, wherein the pH is provided by a carbonate/bicarbonate buffer;

optionally, an amount of a surfactant effective to wet a through hole; and an aqueous dispersing medium.

2. The composition of claim 1 wherein the graphite is a synthetic graphite.

3. The composition of claim 2 wherein the graphite has a mean particle size that is within the range of about 0.3 to 1.0 microns.

4. The composition of claim 3 wherein the graphite has a mean particle size within the range of about 0.7 to about 1.0 microns.

5. The composition of claim 4 wherein the water soluble or dispersible binding agent is sodium carboxymethylcellulose.

6. The composition of claim 5 wherein the anionic dispersing agent has a molecular weight less than 1000 Daltons.

7. The composition of claim 1 wherein the surfactant, if present, includes an anionic fluorochemical surfactant.

8. The composition of claim 7 wherein the dispersing agent for dispersing the bound graphite particles is one or two emulsion polymers.

* * * * *